United States Patent [19]
Southworth et al.

[11] Patent Number: 5,471,947
[45] Date of Patent: Dec. 5, 1995

[54] PREPARATION OF DIAMOND FILMS ON SILICON SUBSTRATES

[75] Inventors: Paul Southworth, Bletchley; David S. Buhaenko, Guildford; Peter J. Ellis, Farnham; Carolyn E. Jenkins, Woking, all of England; Brian R. Stoner, Raleigh, N.C.

[73] Assignee: Kabushiki Kaisha Kobe Seiko SHO, Kobe, Japan

[21] Appl. No.: 108,287

[22] Filed: Aug. 19, 1993

[30] Foreign Application Priority Data

Sep. 3, 1992 [GB] United Kingdom .................... 9218677
Mar. 9, 1993 [GB] United Kingdom .................... 9304749

[51] Int. Cl.⁶ .................................................. C30B 29/04
[52] U.S. Cl. ................... 117/94; 117/89; 117/85; 117/90; 117/929
[58] Field of Search ............................ 423/446; 117/929, 117/89, 90, 94, 95

[56] References Cited

U.S. PATENT DOCUMENTS

| | | | |
|---|---|---|---|
| 4,767,608 | 8/1988 | Matsumoto et al. | 117/929 |
| 4,830,702 | 5/1989 | Singh et al. | 117/929 |
| 5,087,434 | 2/1992 | Frenklach et al. | 423/446 |
| 5,114,696 | 5/1992 | Purdes | 423/446 |
| 5,270,028 | 12/1993 | Tanabe et al. | 117/929 |
| 5,270,029 | 12/1993 | Yamazaki | 117/929 |
| 5,308,661 | 5/1994 | Feng et al. | 423/446 |

FOREIGN PATENT DOCUMENTS 402867 12/1990 European Pat. Off. .
3-252393 11/1991 Japan .................................. 423/446

OTHER PUBLICATIONS

P 43 29 497.9–43, German Official Action with English Translation.
Letter of FHG IST, Dec. 19, 1994, with English Translation.
Appl. Phys. Lett. 58 (10), 1991, pp. 1036–1038.
J. Mater. Res., vol. 7, Feb. 1992, pp. 257–260.

Primary Examiner—Robert Kunemund
Attorney, Agent, or Firm—Oblon, Spivak, McClelland, Maier & Neustadt

[57] ABSTRACT

A method is disclosed for producing an oriented diamond film on a single crystal silicon substrate which comprises preconditioning the surface of the substrate by exposing the surface of the substrate to a carbon-containing plasma, subjecting the preconditioned surface to electrical bias to effect nucleation of the substrate surface for oriented diamond crystal growth while monitoring the completion of nucleation over the surface of the substrate and depositing crystalline diamond on the nucleated surface from a carbon-containing plasma. The resulting structure comprises a crystalline diamond film on the silicon substrate characterised by oriented columnar diamond crystals which form a substantially uniform tessellated pattern. In practice, the columnar crystals normally have a generally quadrilateral shape whose sides are mutually aligned.

14 Claims, 8 Drawing Sheets

GRAPH OF APPARENT SUBSTRATE TEMPERATURE VERSUS TIME

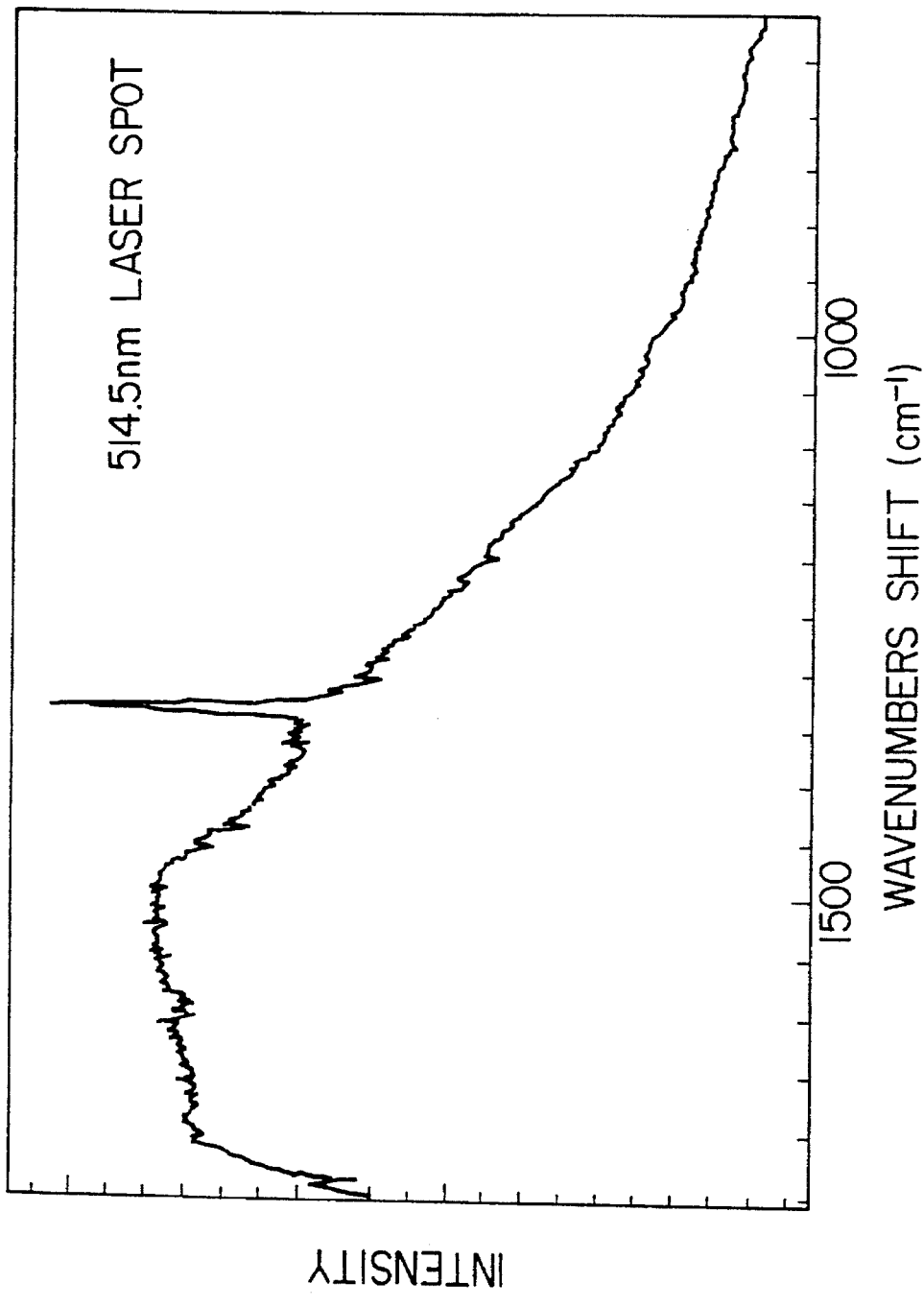
FIG. 7 RAMAN SPECTRUM OF ORIENTED DIAMOND FILM

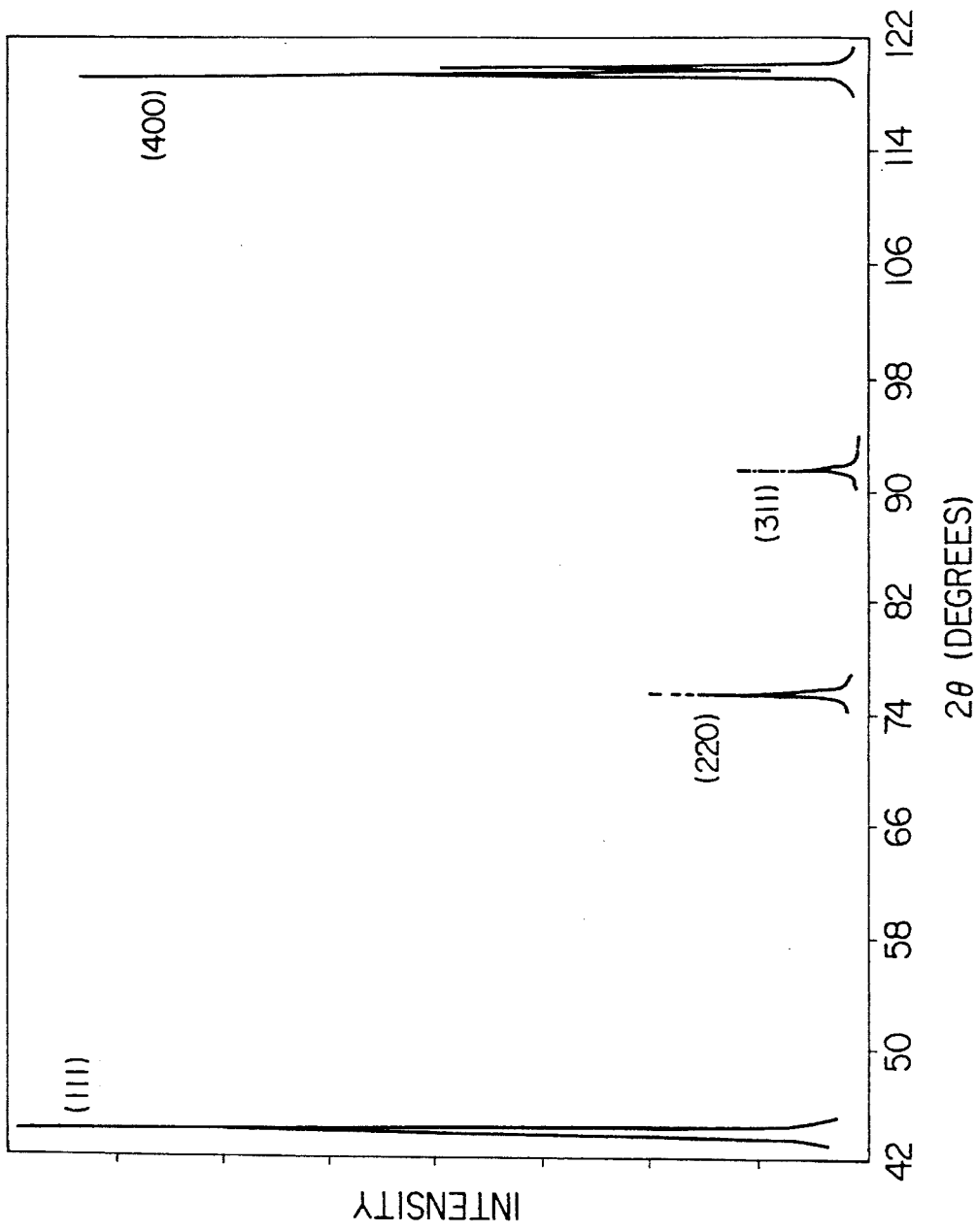

PREPARATION OF DIAMOND FILMS ON SILICON SUBSTRATES

BACKGROUND OF THE INVENTION

This invention is directed to the preparation of diamond films on silicon substrates for use in fabrication of electronic devices. Specifically this invention relates to a method whereby oriented diamond particles and films are grown relative to the crystallographic plane of the silicon substrate and to novel structures which are obtainable by such method. This invention may be used in the formation of heteroepitaxially grown diamond films for fabrication of semi-conductor electronic devices, such as transistors, diodes and various sensors. Diamond is a desirable material for production of semiconductor devices because it provides a higher energy band gap, higher breakdown voltage and higher saturation velocity compared with traditional materials such as silicon, germanium or gallium arsenide.

DESCRIPTION OF THE PRIOR ART

Among many techniques of growing high quality diamond by chemical vapour deposition (CVD), microwave plasma CVD methods are most frequently used. Because this method uses microwave radiation in an electrode-less configuration to generate a plasma from the reaction gas, the CVD grown diamonds cannot be contaminated by impurities from electrodes.

The diamond films grown by CVD on non-diamond substrates are polycrystalline, consisting of an aggregation of diamond particles of about 0.1 nm or an aggregation of diamonds grown in columnar shapes. Such polycrystalline diamond films contain grain boundaries between diamond grains which act as carrier traps and scattering centres, and significantly decrease the transport properties of the diamond film.

To prevent such effects, it is necessary to reduce the number of grain boundaries within the diamond film. Growth of single crystalline diamond films have been achieved on bulk diamond or boron nitride (BN) crystals. However, the availability of large single crystals of these materials is limited and therefore inappropriate for device fabrication on an industrial scale. Thus, a practical device requires the establishment of a method of growing single crystalline diamond films on readily available non-diamond substrates, such as silicon, if large area films are to become available.

Heteroepitaxial diamond growth requires a suitable substrate and a method of nucleating the diamond film, where the lattice structure of the substrate closely approximates to that of diamond. These aspects have been discussed in the following articles: G-H. M. Ma et al, Journal of Materials Research, Vol. 5, No. 11, 2367, (1990); D. G. Jeng et al, Applied Physics Letters, Vol. 56, No. 20, 1968, (1990); B. R. Stoner et al, Applied Physics Letters, Vol. 60, No. 6,698, (1992), and B.R. Stoner et al, Physical Review, Vol. 45, No. 19, 15 May 1992.

None of these prior authors have, however, disclosed a reliable method of depositing an oriented diamond film on a single crystal silicon wafer. Silicon substrates of good quality are commercially available and it would be highly beneficial to be able to devise a reproducible method of depositing a single crystal diamond film on such a substrate.

SUMMARY OF THE INVENTION

It has now been found that oriented diamond films can be grown on silicon wafers in a reliable manner by a multi-stage process in which the substrate is preconditioned and nucleated under selected conditions followed by a diamond crystal growth phase.

According to one aspect of the present invention, therefore, there is provided a method of growing an oriented diamond film on a single crystal silicon substrate which comprises preconditioning the surface of the substrate by exposing the surface of the substrate to a carbon-containing plasma, subjecting the preconditioned surface to electrical bias to effect nucleation of the substrate surface for oriented diamond crystal growth while monitoring the completion of nucleation over the surface of the substrate and depositing crystalline diamond on the nucleated surface from a carbon-containing plasma.

The products which are obtainable by the method of the invention are believed to be novel per se. Therefore, according to a further aspect of the invention there is provided a structure comprising a crystalline diamond film on a single crystal silicon substrate, said film comprising oriented columnar diamond crystals forming a substantially regular tessellated pattern.

During the nucleation treatment, a negative bias is preferably applied to the substrate by establishing a negative potential while maintaining a constant current through the substrate holder or platform. Current flows from the substrate through the hydrocarbon containing microwave plasma to the electrically earthed walls of the vacuum chamber. The voltage is normally up to about −300 volts, preferably −150 to −250 volts at the substrate with respect to earth. Desirably, the current passing through the substrate is maintained constant at a current .density of between about 1 and 20 mA/cm$^2$ either directly by a current limiting device or indirectly by control of the voltage. This is believed to contribute to controlled nucleation leading to uniformity in grain structure of the diamond film. It is also believed to be beneficial to carry out the nucleation phase over an extended time period, e.g. within the range of 2 to 30 minutes or longer. A longer time will normally be employed at a correspondingly lower current density and longer nucleation times are preferred, e.g. at least 10 or 20 minutes and often more than 30 minutes. Although negative DC bias is preferred, it is possible to employ an AC electrical current bias to the susceptor. Where an AC bias is employed, optimum currents and voltages may not necessarily be the same as for DC bias. Frequencies from AC current bias may be normal mains frequency, e.g. 40/50 Hertz but may range up to RF levels.

The substrate is supported in a treatment chamber on a platform whose position in the chamber is preferably adjustable. The platform comprises a susceptor which preferably incorporates radiofrequency means for heating the substrate directly and separately from the microwave generator for producing the plasma. Preferably, the platform comprises graphite or a refractory metal such as molybdenum, tungsten or tantalum which shrouds a graphite susceptor. The substrate is placed on the platform and the relative areas are such that refractory metal or graphite is exposed beyond the extent of the substrate.

Nucleation times can be further extended by insulating the substrate from the susceptor. One effective way of achieving this is to interpose a layer of refractory electrically insulating material, such as alumina, between the substrate and the susceptor or between the platform and the substrate. The effect of the insulating layer is to increase the bias time which is believed to further improve the quality of the diamond film. Pressed alumina discs about 1 mm in thickness have been used successfully for this purpose.

Preferably, the platform comprises a refractory metal such as molybdenum, tungsten or tantalum, which forms a cap over a graphite susceptor. This has the effect of limiting loss of carbon from the susceptor and thus minimising possible variations in the carbon content of the plasma. The substrate is placed on the platform and the relative areas are such that refractory metal is exposed to the plasma beyond the extent of the substrate. Where an insulating layer, such as an alumina disc is used this is conveniently located in a recess in the top surface of the platform so that the upper face of the substrate is substantially co-planar with the top surface of the platform.

According to another aspect of the invention, it has been found that proper recognition of the end point of the nucleation step influences the quality and reproducibility of the diamond film. Although other techniques can be adopted (e.g. laser interferometry), preferably, this is achieved by determining the point at which the apparent temperature of the substrate begins to rise rapidly. This is illustrated in FIG. 3 of the accompanying drawings. An optical pyrometer can be used to monitor the temperature of the substrate and to indicate the temperature gain.

Referring specifically to FIG. 3, the knee A represents the point where the nucleation stage is started. Nucleation proceeds at an approximately constant apparent temperature of 500–800° C. for a period as indicated by the plateau B. At the point C the optical pyrometer indicates a rapid rise in temperature. As soon as this end point C is detected, the deposition of diamond is triggered. This rapid temperature rise is described as "apparent" because the response of the pyrometer is partly due to a change in the refractive index at the surface of the substrate. The actual temperature rise is probably of the order of 20° C. It will be appreciated that the pyrometer indicates an average rate of apparent temperature change over the substrate rather than pinpointing a particular narrow area of the substrate which may not be typical of the whole.

It is thought to be important to effect separate heating of the substrate by means of radiofrequency energy rather than rely wholly on the heating effect of the plasma.

By virtue of the combination of measures referred to above, it is possible to control the uniformity of the nucleation and to effect nucleation over a longer biasing period. As a result, oriented crystalline diamond films have been formed on 1 and 3 inch (25.4 and 50.8 mms) uncoated silicon wafers.

DETAILS OF THE INVENTION

Referring further to the drawings (wherein like reference numerals designate identical or corresponding parts throughout the several views):

FIG. 1 shows a schematic view of the overall apparatus required for enhanced nucleation and growth of oriented diamond films.

FIG. 2 provides a second view of the said apparatus similar to FIG. 1, but on an enlarged scale and showing more detail.

FIG. 7 is an X-ray diffraction trace of an oriented diamond film produced in accordance with the invention, and FIG. 8 is a Raman Spectrum of an oriented diamond film produced in accordance with the invention.

Figure 1:
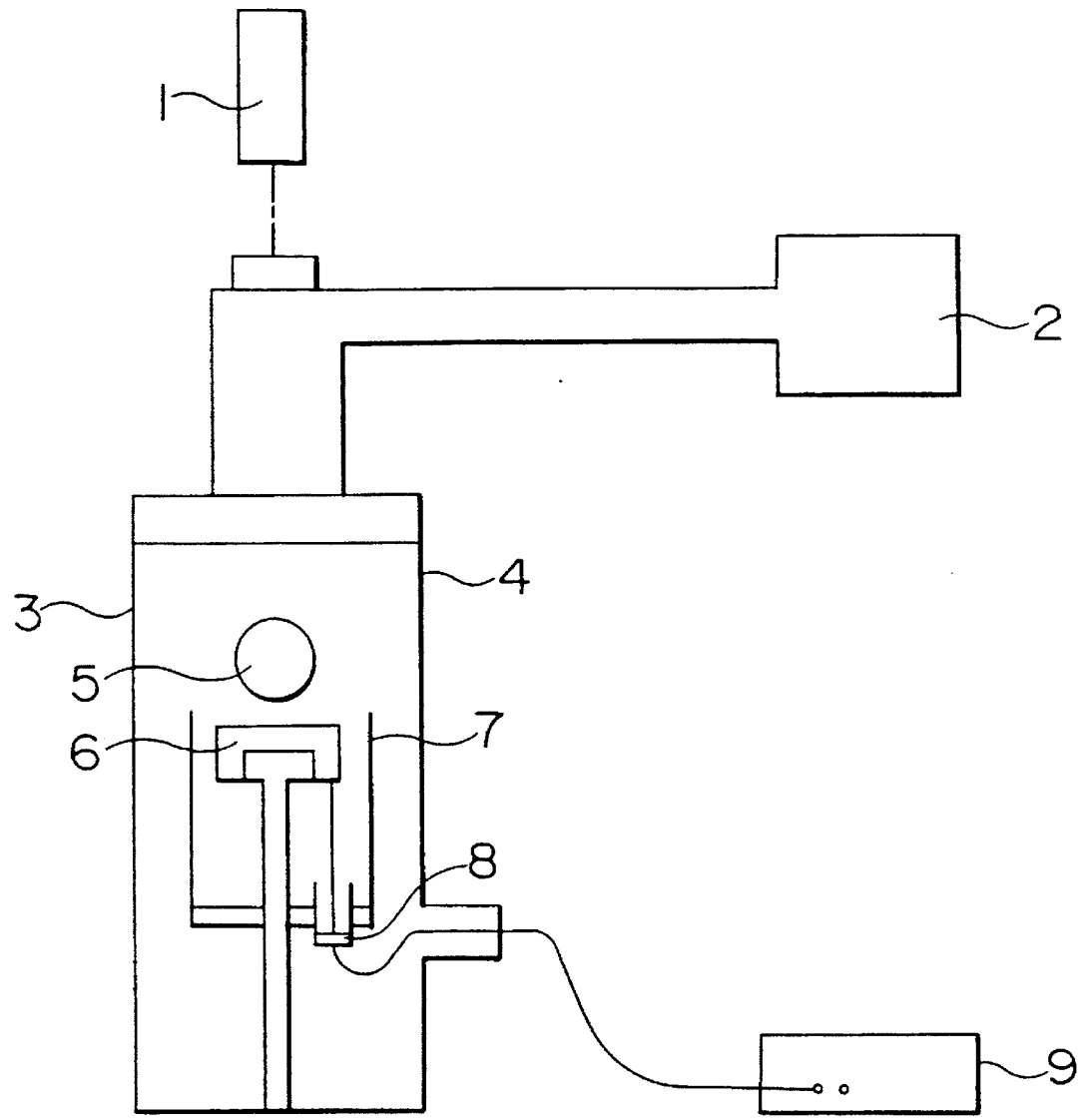
Figure 2:
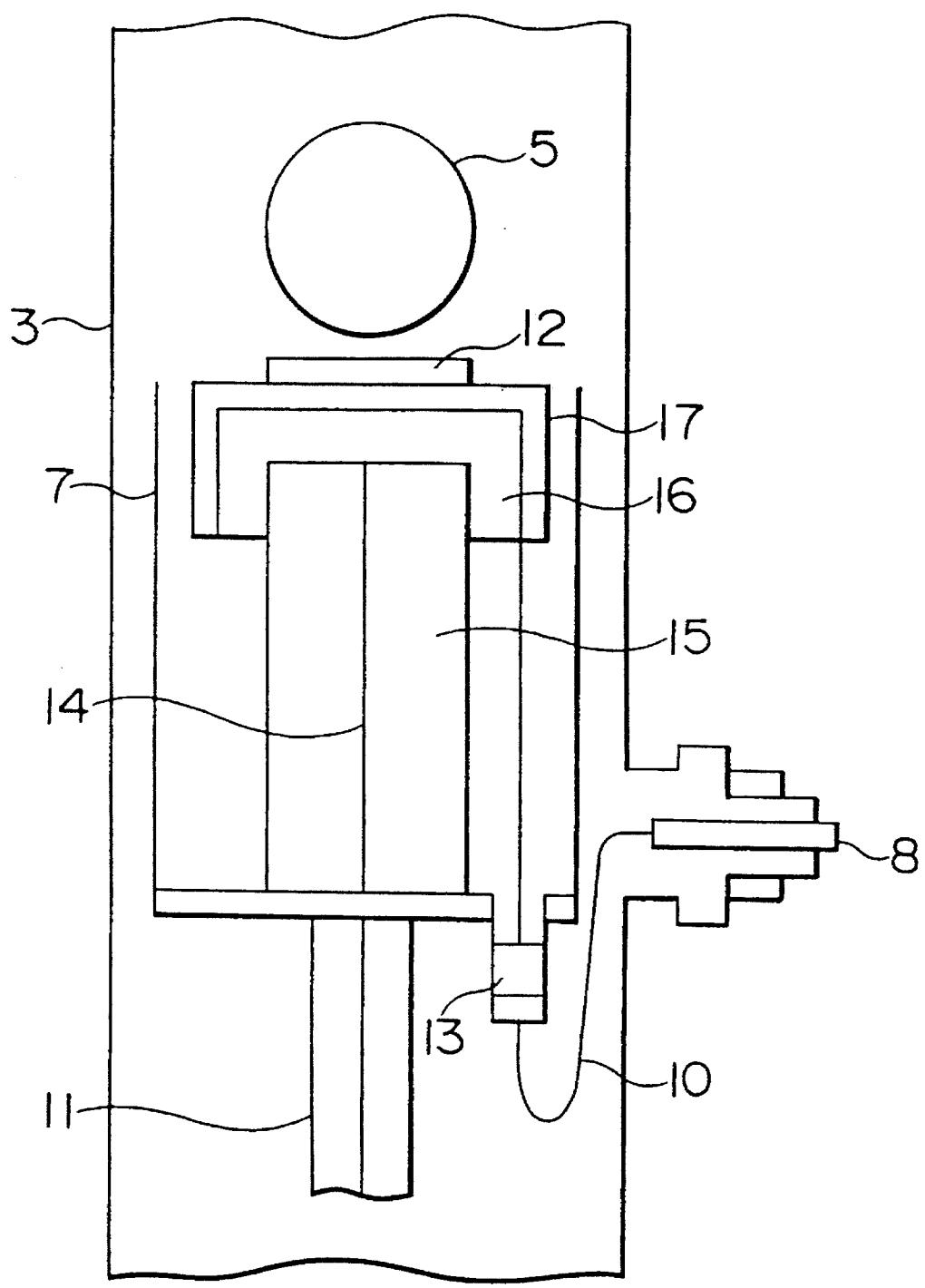
Figure 3:
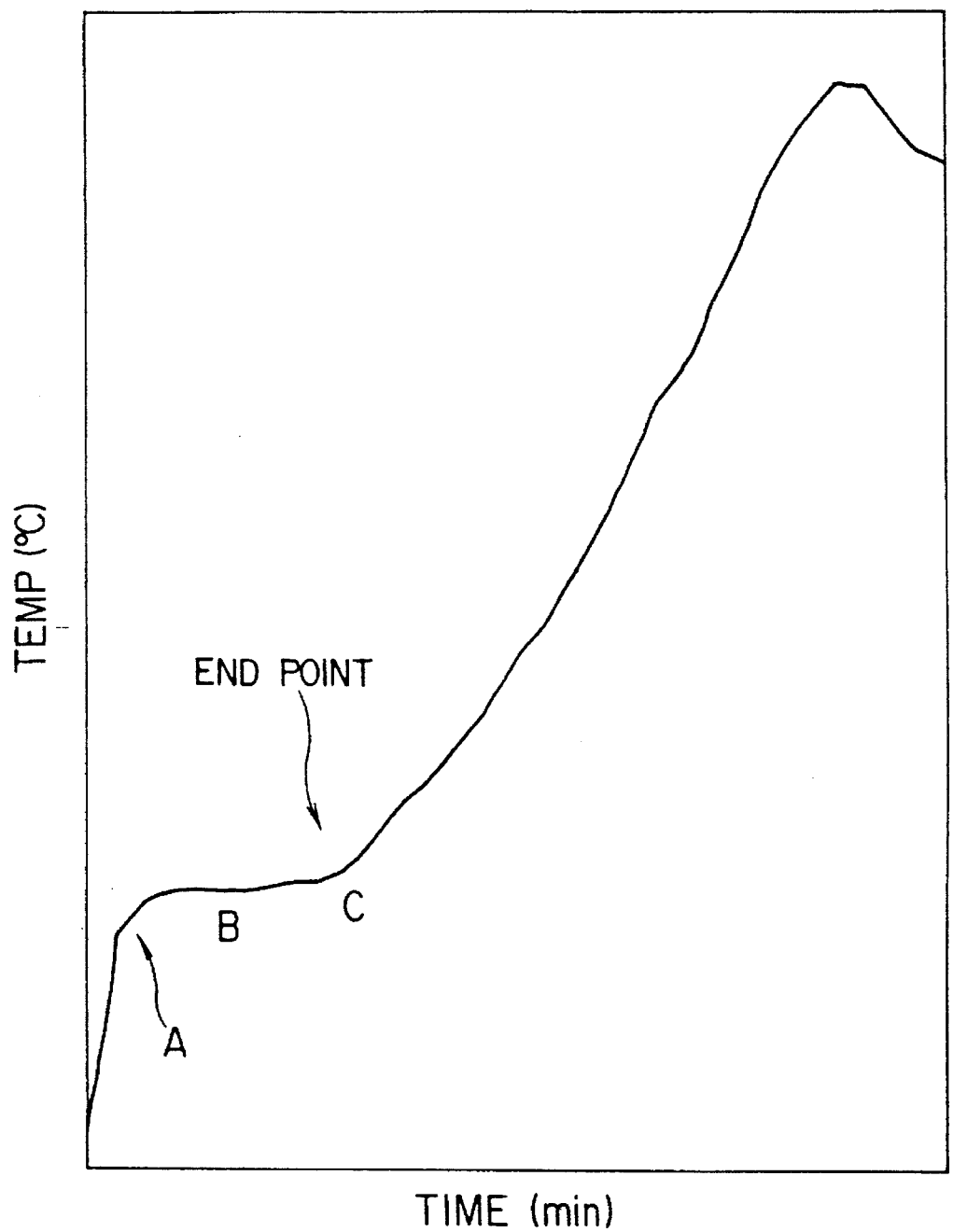
FIG. 3 is a schematic graph of apparent substrate temperature versus time during bias enhanced nucleation. This graph indicates by the arrow the end point when the negative bias should be switched off and diamond deposition triggered.
Figure 4:
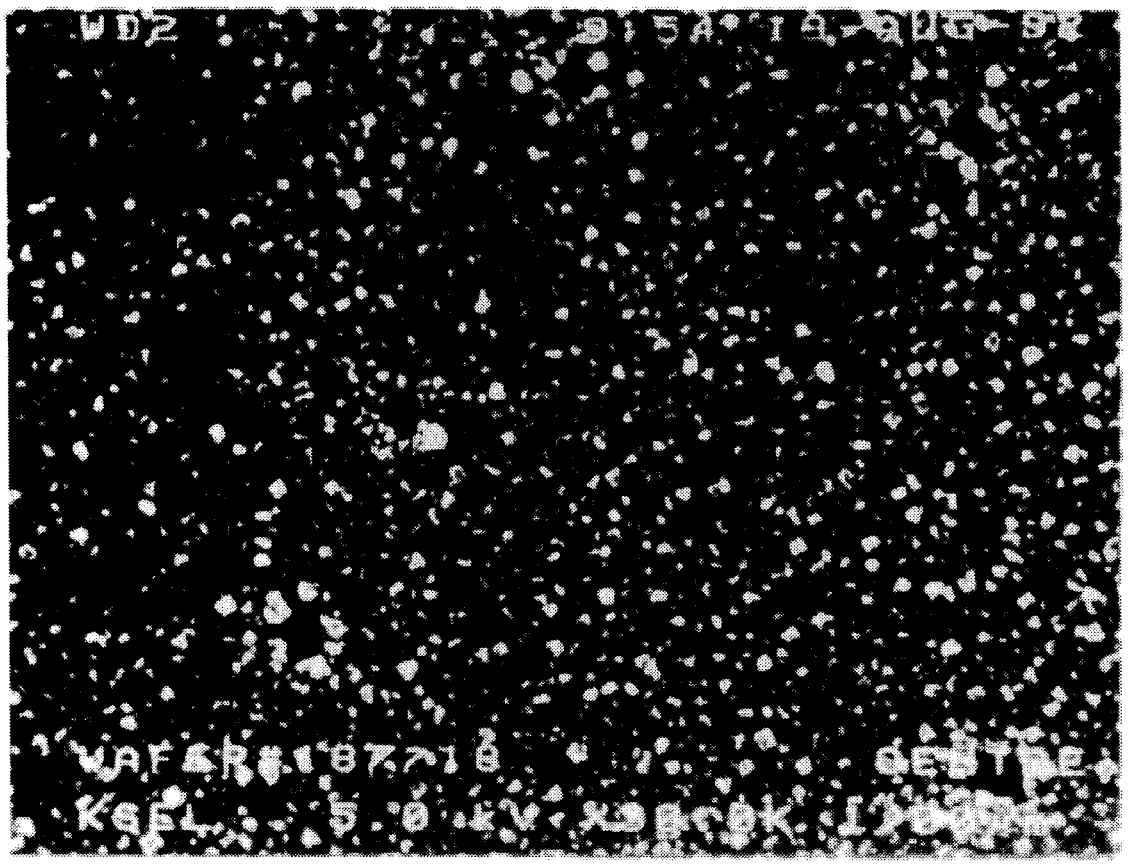
FIG. 4 is a SEM of an oriented nuclei produced in accordance with the preconditioning and nucleation stages of the method of the invention.

The apparatus shown in FIGS. 1 and 2 is designed for growth of polycrystalline diamond films by plasma enhanced microwave assisted means which is able to control the growth conditions within the said apparatus before deposition of diamond by influencing the electric field at the substrate surface through an external device. The extent of this influence is monitored by means of an optical pyrometer 1 (or laser interferometer), whose fluctuations denote the changing stages in the environment at the substrate surface.

Apparatus of the general kind, shown in FIG. 1 is available from Applied Science and Technology Inc., of Woburn, Mass., USA, who manufacture a range of plasma deposition systems. The commercially available apparatus is modified, as shown in FIG. 2. Plasma is generated by a 1.5 KW microwave power source (2) which is coupled to the treatment chamber (4). A plasma ball (5) is generated in the region of a substrate (12). An assembly comprising a machined metal cap encasing a modified graphite substrate holder is situated upon and electrically insulated from the chamber wall (3) by a ceramic shroud 7. In this particular case, the outside diameter of the metal cap is 100 mm and this system is designed so as to be larger than the total area of the substrate, which may be equal to or greater than a circular disc of diameter of 75 mm. The assembly can be mounted on a motor driven stem (11) so that it can be raised and lowered to adjust the position of the substrate 12 relative to the plasma ball.

The material of the cap 17 is determined to be a refractory metal, and molybdenum is the most preferred. A direct current negative voltage is applied to the metal cap by means of an external power source 9 which is fed into the evacuated growth apparatus by means of a standard vacuum compatible electrical feedthrough 8, 13 and an insulated electrically conducting metal wire 10.

The power source supplies a direct current negative voltage which is automatically controlled by adjustment of the applied voltage so as to maintain a fixed current through the substrate holder. The power source 9 was a Sorensen DCS Series 600-I.T. power supply which was adjusted to supply a constant current. Alternatively, biasing can also be achieved by maintaining the applied voltage constant.

Nucleation of a diamond film onto single crystal substrate by application of a bias voltage is monitored by means of an optical pyrometer 1 (or laser interferometer) mounted as in FIG. 1 so as to detect light emitted from the substrate during application of a biasing current under microwave assisted, plasma chemical vapour deposition means.

Heating of the substrate is independently effected by a source (13) incorporated in the susceptor 15. This may take the form of a radiofrequency coil located within the susceptor 15. For the growth of a single crystal diamond film on single crystal silicon wafer, a single crystal silicon wafer is placed within the growth environment under the moderate vacuum required to stimulate a carbon-containing plasma;

the most preferred gas composition is a hydrocarbon/hydrogen mixture, e.g. a mixture of hydrogen and a saturated or unsaturated hydrocarbon which is gaseous at the treatment temperature, e.g. methane or ethane. Other sources of carbon may be employed, e.g. as described in Matsumoto et al, J. Mater. Sci. 17, 3106 (1982). Highly pure gases are employed, e.g. 99.999% pure.

The formation of oriented diamond films in accordance with this invention is normally a three stage process in which the stages are generally carried out sequentially. In a first stage, the substrate is conditioned by exposing the surface to a carbon-containing plasma for a period of up to a few hours, preferably about one hour, before commencement of biasing. During the conditioning stage, the source gas should contain at least carbon (C) hydrogen (H) with the C/H ratio between 0.1% and 10%, the gas pressure is 1 to 100 Torr and the substrate temperature is between 500° C. and 1000° C. Preferred conditions which have been found to be especially effective in the case of 1 inch silicon wafer substrates are as follows: about 2% by volume of methane ($CH_4$) diluted with hydrogen at a pressure of about 15 Torr, a substrate temperature of 800° C., microwave power of 800 W and a total gas flow of 400 sccm, circulated through the treatment chamber.

After the conclusion of the conditioning step, a biasing current is applied to the silicon substrate while continuing to heat the substrate. The duration of biasing treatment by this means is monitored by optical pyrometry 1 (or laser interferometry). At the point at which nucleation is Judged to be complete (as indicated by an increase in the rate of apparent temperature rise), the biasing current is terminated and conditions within the plasma are adjusted for optimum growth of diamond film.

Diamond crystal growth may be triggered by switching off the negative bias, and changing the conditions such that diamond preferentially grows in a direction perpendicular to the (100) plane of the silicon substrate. With correct conditions a diamond film composed of columnar crystals results. Each column has a generally square cross section, and if growth is carefully controlled a smooth diamond film can be grown in which the square facets are azimuthally aligned. X-ray diffraction analysis of the diamond layer confirm preferred orientation of the diamond layer in the (100) direction. It has been determined that temperature, pressure and microwave power have the most significant influence upon growth of square faceted columnar diamond crystals by microwave plasma deposition.

As mentioned above, slow nucleation is desirable and should preferably be carried out over a time of at least about 8 to 9 minutes. When the substrate is insulated from the susceptor, the nucleation time can be extended to about 30 minutes or more. As mentioned above, increase in the biasing time is achieved by placing an insulating layer on the metal or graphite platform, with the silicon substrate resting on the insulating layer. Because an insulating layer on the susceptor can influence the bias process, care must be taken to ensure that the silicon wafer is in good contact with the metal susceptor if reproducible operating conditions are required. To this end it is necessary to regularly clean off carbonaceous deposits which form on the susceptor during diamond growth. Use of a graphite susceptor would be an alternative way of overcoming this problem because it is electrically conducting, and carbonaceous residues do not tend to form on this material when exposed to a microwave plasma for diamond growth.

The inventors have found that in general the following range of biasing conditions and biasing times may be employed to achieve growth of oriented diamond films; the source gas should contain at least carbon (C) and hydrogen (H) with the C/H ratio between 0.1% and 10%, the gas pressure is between 1 to 50 Torr, the substrate temperature is between 500° C. and 800° C., the bias current is between 1 $mA/cm^2$ and 20 $mA/cm^2$ (especially 2.5 to 10 $mA/cm^2$), the biasing time is between 1 and 60 minutes (especially 2 to 30 minutes) and the gas flow is between 10 and 1000 sccm. Most preferred conditions which have been found to be especially effective when using 1 inch silicon wafer substrates are: the source gas is 5.18% methane by volume ($CH_4$) diluted by hydrogen, the gas pressure is 23.1 Torr, the substrate temperature is 500° C., the bias current is 6.6 $mA/cm^2$ and the biasing time is between 10 and 15 minutes. $H_2$/hydrocarbon gas flow is preferably controlled at a rate of about 500 sccm.

Nucleation of diamond onto single crystal silicon wafers under the said conditions using the said pretreatment for both the single crystal silicon wafers and the substrate holder can result in complete nucleation of the substrate surface in as little as two minutes. The degree of nucleation influences the subsequently grown diamond film and the authors have found that optimum quality diamond films are prepared by slow nucleation under longer bias times and by careful end pointing of the bias procedure. This is observed by optical pyrometry (or laser interferometry) where complete nucleation is seen as a change in apparent temperature at the substrate surface. By continuous monitoring of temperature during biasing and accumulating a body of trend data, the correct position for termination of biasing can be assessed.

After termination of biasing the conditions within the carbon containing plasma are adjusted for diamond film growth. Columnar diamond growth is required in which fastest growth in the (100) direction takes place. Without careful control of processing conditions random growth or preferred growth in an undesired crystal direction results and an aligned diamond film does not form. Hence well oriented Nuclei from pretreatment and biasing do not ensure an oriented diamond film. The range of growth conditions are as follows: the source gas should contain at least carbon (C) and hydrogen (H) with the C/H ratio between 0.1% and 10%, the gas pressure is between 1 to 100 Torr, the substrate temperature is between 500° C. and 1000° C. Most preferred conditions, especially when using the 1 inch silicon waters mentioned above are: the source gas is 5.2% by volume of methane ($CH_4$) diluted by hydrogen, the gas pressure is 35 Torr, the substrate temperature is 610° C., the microwave power is 850 W, and the total gas flow is 450 sccm.

BEST MODE

The following Example illustrates the method of the invention.

EXAMPLE

1) A 1 inch (25.4 mm) silicon wafer is placed onto the molybdenum platform and exposed to a methane/hydrogen microwave plasma for a period of one hour. The operating conditions are 2% by volume of methane diluted by hydrogen, 15 Torr pressure, 800° C. substrate temperature, 800 W microwave power and 400 sccm total gas flow.

2) After completion of step 1) above, the substrate is subjected to a negative dc bias of current density 6.6 $mA/cm^2$ for a period between 10 and 15 minutes, whilst being exposed to a methane/hydrogen microwave plasma.

The operating conditions are 5.18% by volume of methane diluted by hydrogen, 23.1 Torr pressure, 500° C. substrate temperature, 800 W microwave power and 500 sccm total gas flow. Completion of the bias step is monitored by optical pyrometry measurements.

Figure 6:
FIG. 6 is a SEM of the surface of a control wafer in which a diamond film was deposited without negative bias.

3) When biasing is finished, the plasma conditions are altered to enable the growth of columnar diamond crystals to proceed. The growth conditions are 5.2% by volume of methane diluted by hydrogen, 35 Torr pressure, 610° C. substrate temperature, 850 W microwave power and 450 sccm total gas flow. With these conditions an 11 μm film is grown after twenty hours and an SEM of the resulting film is shown in FIG. 6.

By use of said current controlled bias enhanced nucleation, the rate of diamond growth on silicon wafers is increased significantly as compared to other substrate preparation methods such that even with low diamond growth conditions, a complete diamond film is formed on a 3 inch silicon wafer in less than three hours.

Figure 5:
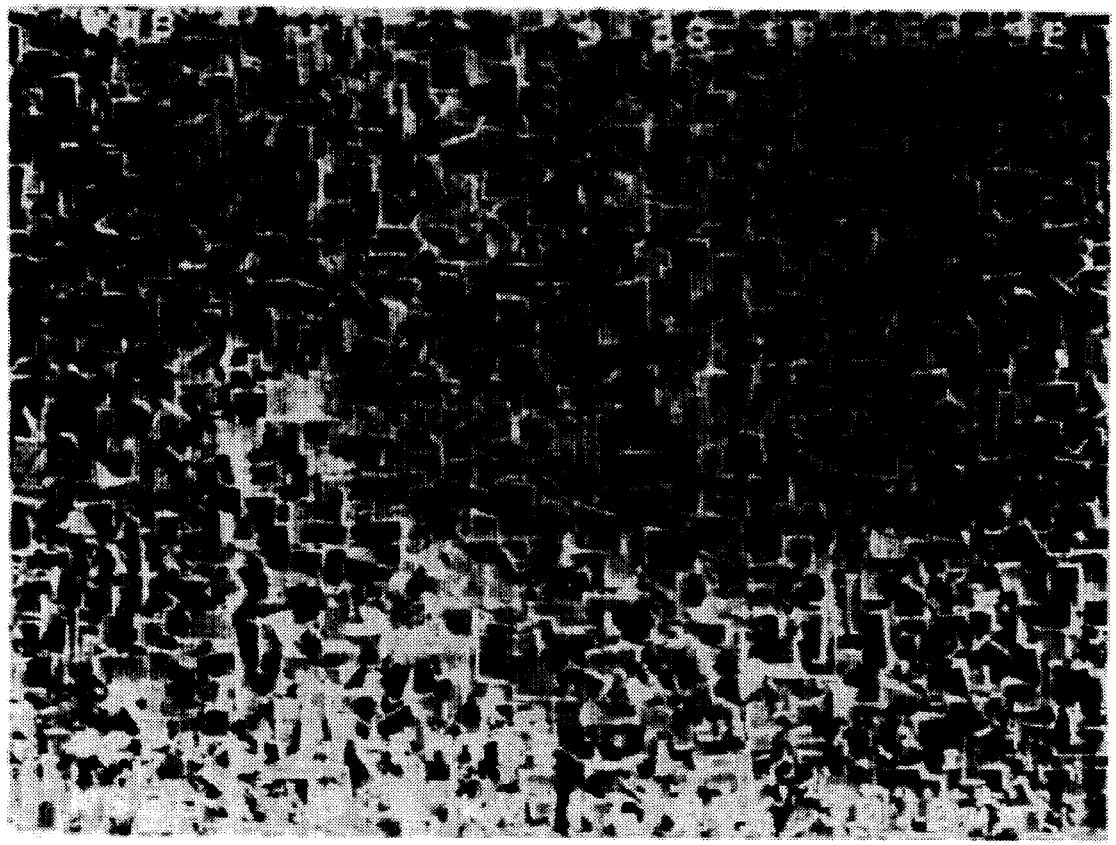
FIG. 5 is a SEM of the oriented diamond film produced by diamond growth onto a nucleated surface in accordance with the invention. The uniformity of structure is clearly apparent.

As can be seen from FIG. 5, the diamond film produced in accordance with the method of the invention is characterised by a uniform grain structure with columnar diamond crystals oriented on a common axis. Raman spectral analysis indicates that the film is of high quality showing a low degree of contamination by other forms of carbon. FIG. 7. X-ray diffraction analysis shows that the film is composed of columnar crystals, with a strong texture in the (100) direction. FIG. 8. Typically, diamond films of over 20 microns in thickness have been prepared by the method of this invention. This oriented structure and uniformity of grain size typically extends over at least 90% to 95% of the area of the substrate.

It is important to note that all three stages of the process must be controlled if oriented diamond layers are to be formed.

FIG. 6 shows the effect of growing a diamond film on a scratched silicon wafer. As can be seen, in contrast with the diamond film of FIG. 5, the film consists of a disordered structure showing no orientation of the diamond and a lack of uniformity in crystal size.

The resulting products have a regular or uniform tessellated structure when viewed from above and exhibit a minimum of grain boundaries. The tessellations are generally quadrilateral in the (100) plane with their sides substantially aligned. While the columnar diamond growths which form the tessellations may show some variations in height, a planar surface to the diamond film may be achieved by conventional finishing procedures.

The diamond films produced in accordance with the present invention may be doped to provide p– type and p+ type doped regions. This may be done, for example, by introducing a minor amount of a dopant precursor, such as diborane, in the gas mixture in the CVD treatment chamber during the crystal growth phase. Alternatively, a doped diamond film may be deposited onto the oriented diamond film in a subsequent processing step.

We claim:

1. A method of growing an oriented diamond film on a single crystal silicon substrate which comprises preconditioning the surface of the substrate by exposing the surface of the substrate to a carbon-containing plasma, subjecting the preconditioned surface to electrical bias to effect nucleation of the substrate surface for oriented diamond crystal growth while monitoring the completion of nucleation over the surface of the substrate and depositing crystalline diamond on the nucleated surface from a carbon-containing plasma, wherein the end of the nucleation phase is detected by determining when the apparent temperature of the surface of the substrate markedly increases.

2. A method according to claim 1 wherein a negative D.C. bias is applied to the substrate.

3. A method according to claim 2 wherein the current flowing through the substrate during the negative biasing stage is maintained constant at a level between about 1 and 20 mA/cm$^2$.

4. A method according to any one of claims 1, 2 or 3 in which the substrate is supported on a platform comprising a refractory metal, the refractory metal platform extending beyond the area covered by the substrate.

5. A method according to claim 4 in which the platform comprises molybdenum, tungsten or tantalum.

6. A method according to claim 4 in which the platform is supported in contact with a graphite susceptor which includes radiofrequency heating means.

7. A method according to any one of claims 1, 2 or 3 in which the substrate is supported on a platform while being electrically insulated therefrom.

8. A method according to claim 7 wherein the substrate is electrically insulated from the platform by means of a metal oxide plate.

9. A method according to any one of claims 1, 2 or 3 wherein the substrate is preconditioned by exposure to a carbon-containing plasma for a time period of between 10 minutes and 10 hours.

10. A method according to any one of claims 1, 2 or 3 in which diamond growth is carried out in the absence of electrical bias under conditions of temperature and pressure so as to promote columnar growth of crystalline diamond on the nucleated surface.

11. A method according to claim 10 in which the diamond growth on the nucleated surface is carried out in an atmosphere of increased pressure compared with the nucleation phase.

12. A method according to claim 10 wherein the diamond growth is carried out at a temperature between about 500 and 1000° C.

13. A method according to any one of claims 1, 2 or 3 wherein the substrate is supported on a platform which is in contact with a graphite susceptor and heated by radiofrequency heating means.

14. A method according to any one of claims 1, 2 or 3 wherein a gaseous dopant is introduced into the carbon-containing plasma during the step of depositing the crystalline diamond onto said nucleated surface.

* * * * *